(12) United States Patent
Xu

(10) Patent No.: US 8,557,685 B2
(45) Date of Patent: Oct. 15, 2013

(54) MEMORY CELL THAT INCLUDES A CARBON-BASED MEMORY ELEMENT AND METHODS OF FORMING THE SAME

(75) Inventor: Huiwen Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 966 days.

(21) Appl. No.: 12/536,463

(22) Filed: Aug. 5, 2009

(65) Prior Publication Data

US 2010/0032643 A1 Feb. 11, 2010

Related U.S. Application Data

(60) Provisional application No. 61/087,164, filed on Aug. 7, 2008.

(51) Int. Cl.
*H01L 21/20* (2006.01)
*H01L 47/00* (2006.01)

(52) U.S. Cl.
USPC .. 438/478; 257/4; 257/E21.158; 257/E45.002

(58) Field of Classification Search
USPC ................ 438/478; 257/4, E22.158, E45.002
See application file for complete search history.

(56) References Cited

U.S. PATENT DOCUMENTS

| | | | |
|---|---|---|---|
| 4,499,557 A | 2/1985 | Holmberg et al. | |
| 4,646,266 A | 2/1987 | Ovshinsky et al. | |
| 5,915,167 A | 6/1999 | Leedy | |
| 6,072,716 A | 6/2000 | Jacobson et al. | |
| 6,566,278 B1 | 5/2003 | Harvey et al. | |
| 6,753,561 B1 | 6/2004 | Chevallier et al. | |
| 6,756,605 B1 | 6/2004 | Reed et al. | |
| 6,900,002 B1 | 5/2005 | Plat et al. | |
| 6,952,030 B2 | 10/2005 | Herner | |
| 7,176,064 B2 | 2/2007 | Herner | |
| 7,220,982 B2 | 5/2007 | Campbell | |
| 7,288,784 B2 | 10/2007 | Moore et al. | |
| 7,309,616 B2 | 12/2007 | Nagashima et al. | |
| 7,344,946 B2 | 3/2008 | Moore et al. | |
| 7,348,653 B2 | 3/2008 | Cho et al. | |
| 7,354,631 B2 * | 4/2008 | Fuss et al. ..................... | 427/569 |

(Continued)

FOREIGN PATENT DOCUMENTS

| | | |
|---|---|---|
| CN | 101000866 A | 7/2007 |
| CN | 101132052 A | 2/2008 |

(Continued)

OTHER PUBLICATIONS

Scheuerlein et al., U.S. Appl. No. 13/351,468, filed Jan. 17, 2012.

(Continued)

*Primary Examiner* — Fernando L Toledo
*Assistant Examiner* — Moazzam Hossain
(74) *Attorney, Agent, or Firm* — Dugan & Dugan, PC

(57) ABSTRACT

Memory cells, and methods of forming such memory cells, are provided that include a carbon-based reversible resistivity switching material. In particular embodiments, methods in accordance with this invention form a memory cell by (a) depositing a layer of the carbon material above a substrate; (b) doping the deposited carbon layer with a dopant; (c) depositing a layer of the carbon material over the doped carbon layer; and (d) iteratively repeating steps (b) and (c) to form a stack of doped carbon layers having a desired thickness. Other aspects are also provided.

20 Claims, 14 Drawing Sheets

(56) References Cited

U.S. PATENT DOCUMENTS

| | | | |
|---|---|---|---|
| 7,405,465 | B2 | 7/2008 | Herner |
| 7,608,467 | B2 | 10/2009 | Wu et al. |
| 7,713,592 | B2 * | 5/2010 | Nguyen et al. ............... 427/535 |
| 7,768,016 | B2 | 8/2010 | Kreupl |
| 2002/0064069 | A1 | 5/2002 | Goebel et al. |
| 2003/0032305 | A1 | 2/2003 | Yau et al. |
| 2003/0179559 | A1 | 9/2003 | Engelhardt et al. |
| 2004/0023475 | A1 | 2/2004 | Bonser et al. |
| 2005/0006640 | A1 | 1/2005 | Jackson et al. |
| 2005/0035380 | A1 | 2/2005 | Derycke et al. |
| 2005/0074956 | A1 | 4/2005 | Autryve et al. |
| 2005/0148174 | A1 | 7/2005 | Unger et al. |
| 2006/0038212 | A1 | 2/2006 | Moore et al. |
| 2006/0250836 | A1 | 11/2006 | Herner |
| 2007/0007579 | A1 | 1/2007 | Scheuerlein et al. |
| 2007/0021293 | A1 | 1/2007 | Furukawa et al. |
| 2007/0190722 | A1 | 8/2007 | Herner |
| 2007/0202610 | A1 | 8/2007 | Chiang et al. |
| 2008/0070162 | A1 * | 3/2008 | Ufert ............................. 430/290 |
| 2008/0099752 | A1 | 5/2008 | Kreupl et al. |
| 2008/0102278 | A1 | 5/2008 | Kreupl et al. |
| 2008/0237599 | A1 | 10/2008 | Herner et al. |
| 2008/0239790 | A1 | 10/2008 | Herner et al. |
| 2009/0168491 | A1 * | 7/2009 | Schricker et al. ............. 365/148 |
| 2009/0256132 | A1 | 10/2009 | Scheuerlein |
| 2010/0012912 | A1 | 1/2010 | Schricker |
| 2010/0032638 | A1 | 2/2010 | Xu |
| 2010/0032639 | A1 | 2/2010 | Xu |
| 2010/0181546 | A1 * | 7/2010 | Yamamoto et al. ............... 257/2 |
| 2011/0287270 | A1 * | 11/2011 | Tsurumi et al. ............... 428/457 |

FOREIGN PATENT DOCUMENTS

| | | |
|---|---|---|
| EP | 1 763 037 | 3/2007 |
| EP | 1763037 A1 | 3/2007 |
| EP | 1 892 722 A | 2/2008 |
| EP | 1 916 722 | 4/2008 |
| KR | 20090011933 | 2/2009 |
| WO | WO 98/45847 | 10/1998 |
| WO | WO 2004/052781 A | 6/2004 |
| WO | WO 2004/070735 | 8/2004 |
| WO | WO 2005/019104 | 3/2005 |
| WO | WO 2007/008902 | 1/2007 |
| WO | WO 2008/021900 | 2/2008 |
| WO | WO 2008/082897 | 7/2008 |
| WO | WO 2008/118486 | 10/2008 |
| WO | WO 2009/126871 | 10/2009 |
| WO | WO 2009/126876 | 10/2009 |
| WO | WO 2009/134603 | 11/2009 |

OTHER PUBLICATIONS

International Search Report and Written Opinion of counterpart International Application No. PCT/US2009/053059 mailed Nov. 25, 2009.

Gerstner et al., "Nonvolatile Memory Effects in Nitrogen Doped Tetrahedral Amorphous Carbon Thin Films" Jour. Applied Physics, vol. 84, No. 10, pp. 5647-5651 (1998).

Lemme, M., et al., A Graphene Field-Effect Device, IEEE Electron Device Letters, vol. 28, No. 4, Apr. 2007.

Abbaschian et al. "Physical Metalurgy Principles, 4th edition", 2009, Cengage Learning, Stamford CT, p. 263.

Scheuerlein et al., U.S. Appl. No. 12/418,855, filed Apr. 6, 2009.

Xu, U.S. Appl. No. 12/536,459, filed Aug. 5, 2009.

* cited by examiner

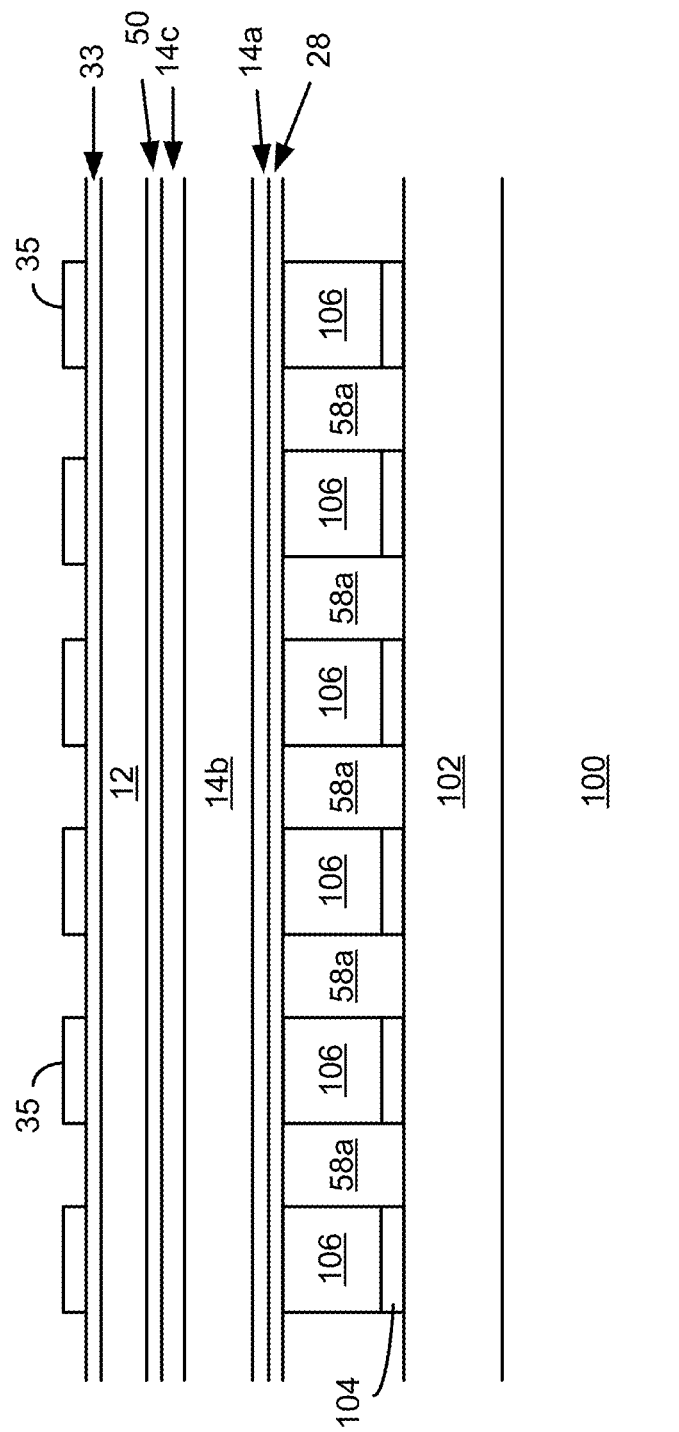

MEMORY CELL THAT INCLUDES A CARBON-BASED MEMORY ELEMENT AND METHODS OF FORMING THE SAME

CROSS-REFERENCE TO RELATED APPLICATIONS

This application claims the benefit of U.S. Provisional Patent Application Ser. No. 61/087,164, filed Aug. 7, 2008, "Methods And Apparatus For Forming Memory Cells Using Carbon Read Writable Materials," which is hereby incorporated by reference herein in its entirety for all purposes.

TECHNICAL FIELD

This invention relates to non-volatile memories, and more particularly to a memory cell that includes a carbon-based memory element, and methods of forming the same.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 application"), which is hereby incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

SUMMARY

In a first aspect of the invention, a method is provided for forming a memory cell comprising a carbon-based reversible resistance switching material, the method including: (a) depositing a layer of the carbon material above a substrate; (b) doping the deposited carbon layer with a dopant; (c) depositing a layer of the carbon material over the doped carbon layer; and (d) iteratively repeating steps (b) and (c) to form a stack of doped carbon layers having a desired thickness.

In a second aspect of the invention, a memory cell is provided, the memory cell including a carbon-based reversible resistance switching material including a stack of deposited carbon layers, each deposited carbon layer comprising a dopant, wherein the stack of doped carbon layers has a desired thickness.

In a third aspect of the invention, a method is provided for forming a memory cell comprising a carbon-based reversible resistance switching material, the method including: (a) depositing a layer of the carbon material above a substrate; (b) depositing a layer of a carbon nitride material on top of the carbon layer; (c) depositing a layer of the carbon material on top of the carbon nitride layer; and (d) iteratively repeating steps (b) and (c) to form a stack of carbon layers having a desired thickness.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-4H illustrate cross-sectional views of a portion of a substrate during an exemplary fabrication of a single memory level in accordance with this invention.

DETAILED DESCRIPTION

Figure 1:
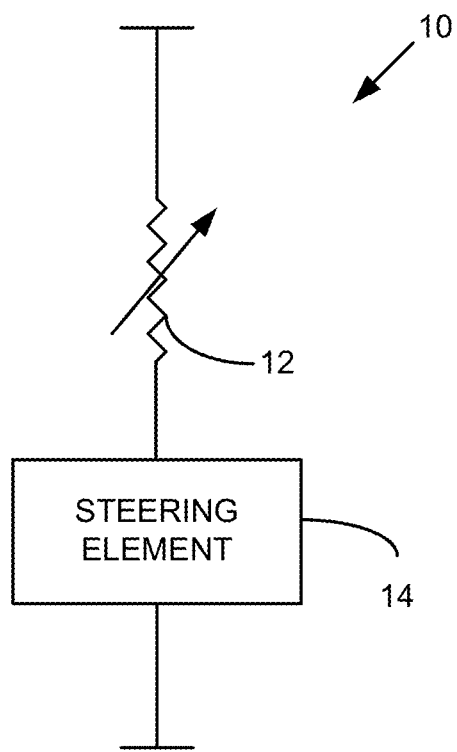
FIG. 1 is a diagram of an exemplary memory cell in accordance with this invention.

Carbon films such as amorphous carbon ("aC") containing nanocrystalline graphene (referred to herein as "graphitic carbon"), graphene, graphite, carbon nano-tubes, amorphous diamond-like carbon ("DLC") (described below), silicon carbide, boron carbide and other similar carbon-based materials may exhibit resistivity-switching behavior that may make such materials suitable for use in microelectronic non-volatile memories.

Indeed, some carbon-based materials have demonstrated reversible resistivity-switching memory properties on lab-scale devices with a 100× mseparation between ON and OFF states and mid-to-high range resistance changes. Such a separation between ON and OFF states renders carbon-based materials viable candidates for memory cells formed using the carbon materials in memory elements in series with steering elements, such as tunnel junctions, diodes, thin film transistors, or the like.

A carbon-based resistivity-switching material may be characterized by its ratio of forms of carbon-carbon bonding. Carbon typically bonds to carbon to form either an $sp^2$-bond (a trigonal carbon-carbon double bond ("C=C")) or an $sp^3$-bond (a tetrahedral carbon-carbon single bond ("C—C")). In each case, a ratio of $sp^2$-bonds to $sp^3$-bonds can be determined via Raman spectroscopy by evaluating the D and G bands. In some embodiments, the range of materials may include those having a ratio such as $M_y N_z$ where M is the $sp^3$ material and N is the $sp^2$ material and y and z are any fractional value from zero to 1 as long as y+z=1. To provide sufficient resistivity-switching behavior useful in a memory device, the carbon-based material should have a relatively high concentration of $sp^2$ graphene crystallinity. DLC tends to be $sp^3$-hybridized, and to be amorphous without short or long range order, also has found to be switchable.

A carbon-based memory element may be formed by arranging a carbon-based material between two electrodes to form a metal-insulator-metal ("MIM") structure. In such a configuration, the carbon-based material sandwiched between the two metal or otherwise conducting layers serves as a reversible resistance-switching element for the memory cell. A memory cell may then be formed by coupling the MIM structure in series with a steering element, such as a diode.

To be compatible with the current limits of the diode, the carbon-based reversible resistance switching element typically must be fabricated from carbon material having a relatively high resistivity. DLC is one such carbon material that has a high resistivity. However, the high resistivity of DLC may require a high set voltage (i.e., the voltage required to convert the DLC from a high resistivity state to a low resistivity state). Such high set voltages may be problematic for several reasons.

First, the voltage of a frond-end metal oxide semiconductor ("MOS") circuit may not be able to supply the high set voltage. Second, high set voltages may be difficult to generate on-chip, and may require additional circuitry that consumes power and chip area. Third, high set voltages may cause memory arrays that include multiple memory cells to exceed current limits for the array. In particular, when a selected memory cell in a memory array is programmed, the diodes in unselected memory cells typically are under a reverse bias having a magnitude approximately equal to the set voltage. Each reverse-biased diode conducts a small reverse bias current. Because a memory array typically includes a large number of such unselected memory cells, the cumulative reverse bias currents may be quite large. In particular, if the memory cells have a high set voltage, the cumulative reverse bias current of the unselected memory cells may exceed the current limit for the array.

Thus, it is desirable to provide a memory cell that includes a carbon-based reversible resistance switching element that has high resistivity for compatibility with the diode, but has a relatively low set voltage so that circuit current limits are not exceeded.

In accordance with this invention, a carbon-based memory element is formed from a carbon-based material, such as DLC, and the carbon-based memory element is doped with another element, such as nitrogen, silicon, boron, phosphorous, fluorine, oxygen, or other similar element. In particular, by using a relatively small dopant concentration, a carbon-based memory element may be provided that has a relatively high bulk resistivity (for compatibility with the diode), but also has a reduced set voltage (so that current limits are not exceeded).

In an exemplary embodiment of this invention, a carbon-based memory element is formed by depositing multiple layers of DLC, each layer deposited on top the previous layer, and then doping each deposited DLC layer with a relatively small concentration of another element, such as nitrogen, silicon, boron, phosphorous, fluorine, oxygen, or other similar element. This deposition-doping process continues in an iterative manner to form a stack of doped DLC layers until a desired thickness for the carbon-based memory element is achieved.

In an alternative exemplary embodiment of this invention, a carbon-based memory element is formed by depositing multiple layers of DLC, each layer deposited on top the previous layer, alternately doping every other deposited DLC layer with a relatively small concentration of another element, such as nitrogen, silicon, boron, phosphorous, fluorine, oxygen, or other similar element. This deposition-alternate-doping process continues in an iterative manner to form a stack of doped DLC layers until a desired thickness for the carbon-based memory element is achieved.

Exemplary Inventive Memory Cell

FIG. 1 is a schematic illustration of an exemplary memory cell 10 in accordance with this invention. Memory cell 10 includes a carbon-based reversible resistance-switching element 12 coupled to a steering element 14. Carbon-based reversible resistance-switching element 12 includes a carbon-based reversible resistivity-switching switching material (not separately shown) having a resistivity that may be reversibly switched between two or more states.

For example, carbon-based reversible resistivity-switching material of element 12 may be in an initial, low-resistivity state upon fabrication. Upon application of a first voltage and/or current, the material is switchable to a high-resistivity state. Application of a second voltage and/or current may return reversible resistivity-switching material to a low-resistivity state. Alternatively, carbon-based reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used. Numerous reversible resistivity-switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 application"), which is hereby incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through carbon-based reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, carbon-based reversible resistance-switching element 12 and steering element 14 are described below with reference to FIGS. 2A-2D and FIG. 3.

Exemplary Embodiments of Memory Cells and Memory Arrays

Figure 2A:
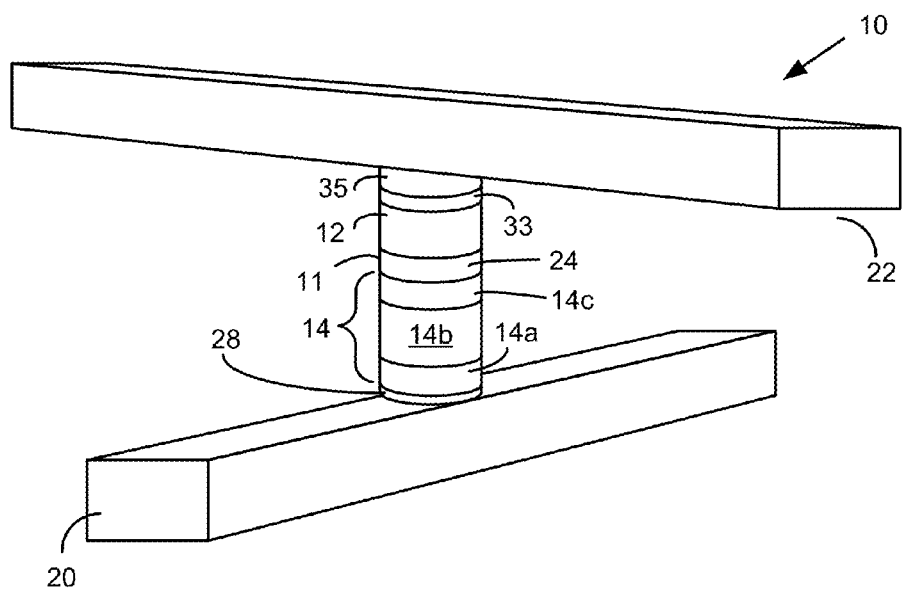
FIG. 2A is a simplified perspective view of an exemplary memory cell in accordance with this invention.

FIG. 2A is a simplified perspective view of an exemplary embodiment of a memory cell 10 in accordance with this invention. Memory cell 10 includes a pillar 11 coupled between a first conductor 20 and a second conductor 22. Pillar 11 includes a carbon-based reversible resistance-switching element 12 coupled in series with a steering element 14. In some embodiments, a barrier layer 24 may be formed between carbon-based reversible resistance-switching element 12 and steering element 14, a barrier layer 28 may be formed between steering element 14 and first conductor 20, and a barrier layer 33 may be formed between carbon-based reversible resistance-switching element 12 and a metal layer 35. Barrier layers 24, 28 and 33 may include titanium nitride, tantalum nitride, tungsten nitride, or other similar barrier layer. In some embodiments, barrier layer 33 and metal layer 35 may be formed as part of upper conductor 22.

Carbon-based reversible resistance-switching element 12 may include a carbon-based material suitable for use in a memory cell. In exemplary embodiments of this invention, carbon-based reversible resistance-switching element 12 may include DLC. In other embodiments, carbon-based reversible resistance-switching element 12 may include other carbon-based materials such as graphitic carbon, graphene, graphite, carbon nano-tube materials, silicon carbide, boron carbide, or other similar carbon-based materials.

In an exemplary embodiment of this invention, steering element 14 includes a diode. In this discussion, steering element 14 is sometimes referred to as "diode 14." Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
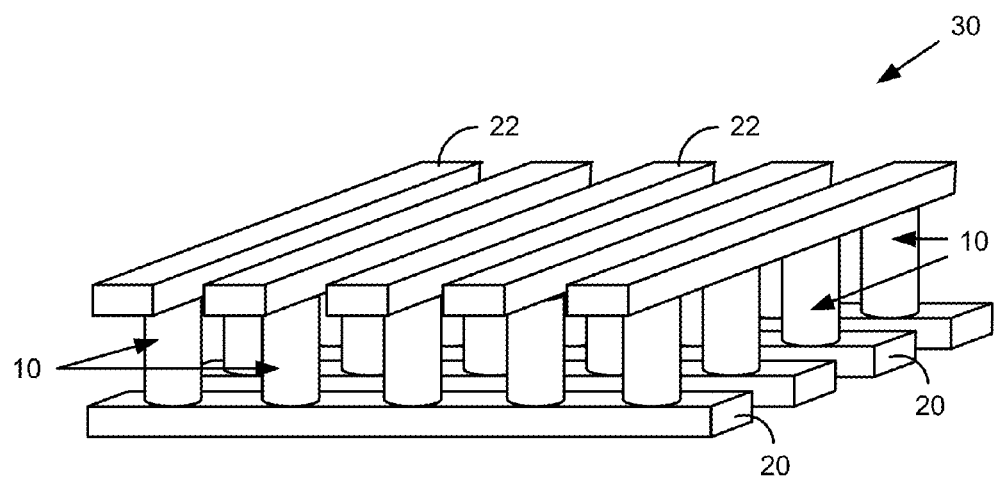
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, carbon-based reversible resistance-switching element 12, diode 14, barrier layers 24, 28 and 33, and metal layer 35 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
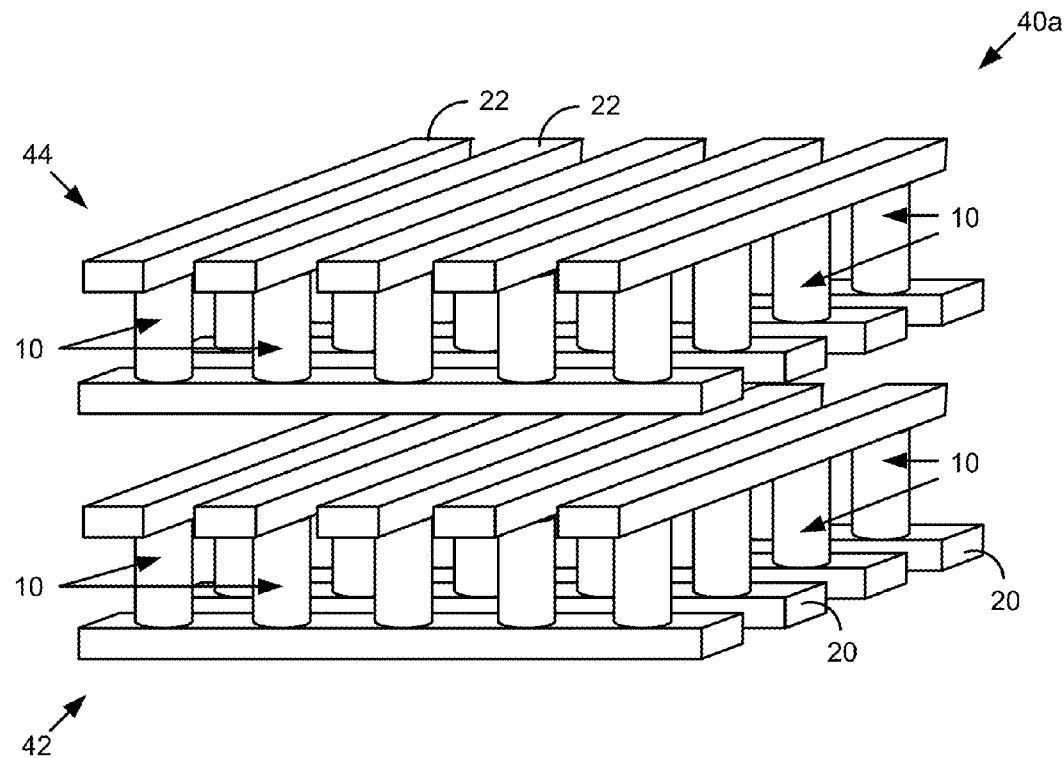
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
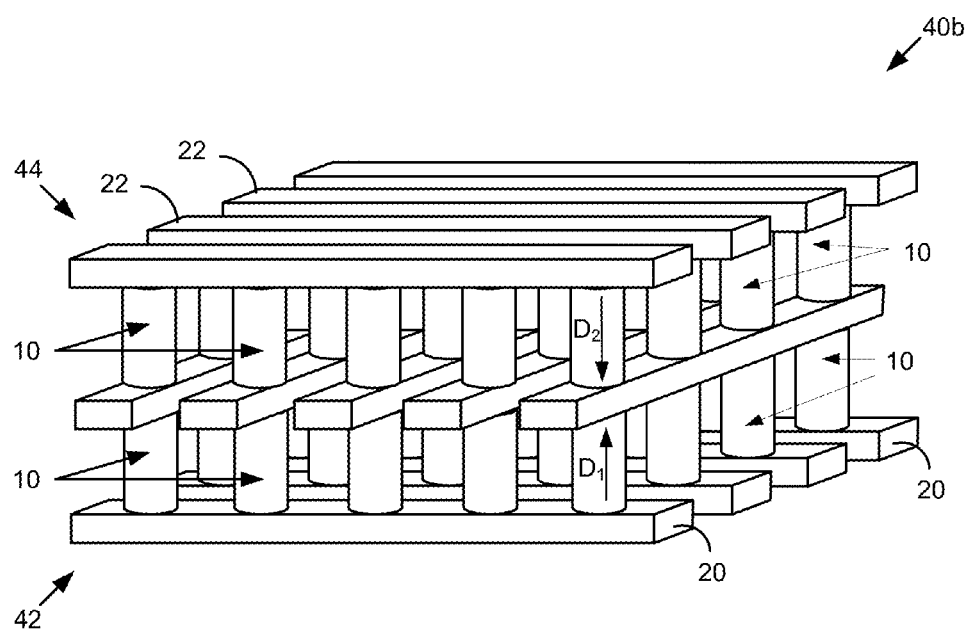
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
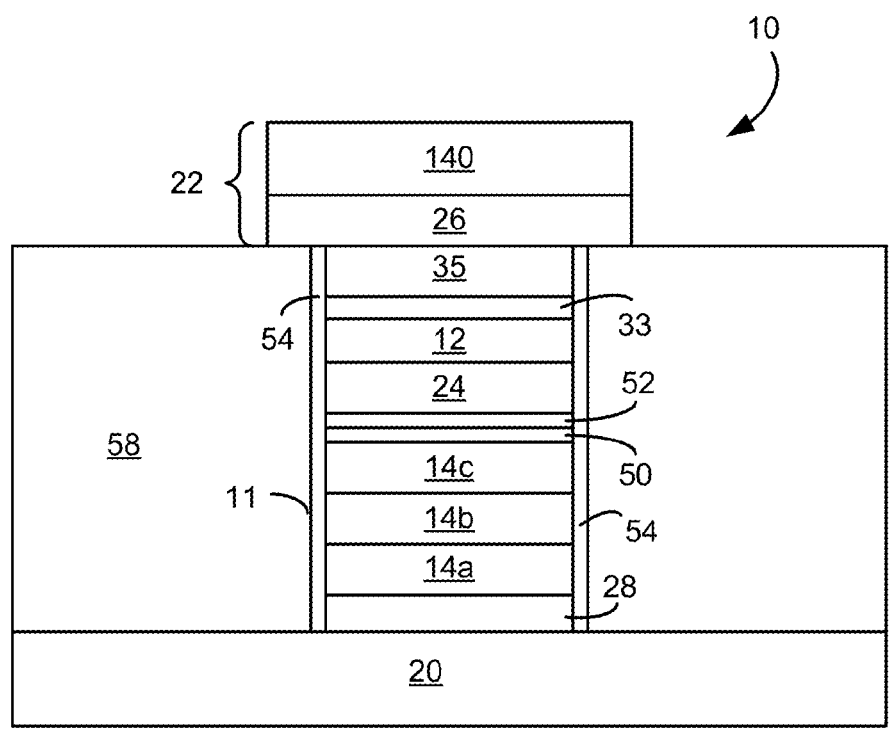
FIG. 3A is a cross-sectional view of an exemplary embodiment of a memory cell in accordance with this invention.

FIG. 3A is a cross-sectional view of an exemplary embodiment of memory cell 10 of FIG. 2A formed on a substrate, such as a wafer (not shown). In particular, memory cell 10 includes a pillar 11 coupled between first and second conductors 20 and 22, respectively. Pillar 11 includes carbon-based reversible resistance-switching element 12 (referred to in the remaining description as "carbon layer 12") coupled in series with diode 14, and also may include barrier layers 24, 28, and 33, a silicide layer 50, a silicide-forming metal layer 52, and a metal layer 35. A dielectric layer 58 substantially surrounds pillar 11. In some embodiments, a sidewall liner 54 separates selected layers of pillar 11 from dielectric layer 58. Adhesion layers, antireflective coating layers and/or the like (not shown) may be used with first and/or second conductors 20 and 22, respectively, to improve device performance and/or facilitate device fabrication.

First conductor 20 may include any suitable conductive material such as tungsten, any appropriate metal, heavily doped semiconductor material, a conductive silicide, a conductive silicide-germanide, a conductive germanide, or the like. Second conductor 22 includes a barrier layer 26, which may include titanium nitride or other similar barrier layer material, and conductive layer 140, which may include any suitable conductive material such as tungsten, any appropriate metal, heavily doped semiconductor material, a conductive silicide, a conductive silicide-germanide, a conductive germanide, or the like.

Diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 application"), which is hereby incorporated by reference herein in its entirety for all purposes. In some embodiments, a few hundred angstroms or less of silicon-germanium alloy with about 10 atomic percent ("at %") or more of germanium may be employed.

A barrier layer 28, such as titanium nitride, tantalum nitride, tungsten nitride, or other similar barrier layer material, may be formed between the first conductor 20 and the n+ region 14*a* (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10, as a large voltage is not required to switch the deposited silicon to a low resistivity state. For example, a silicide-forming metal layer 52 such as titanium or cobalt may be deposited on p+ polysilicon region 14*c*. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14*c*.

A rapid thermal anneal ("RTA") step may then be performed to form silicide regions by reaction of silicide-forming metal layer 52 with p+ region 14*c*. The RTA step may be performed at a temperature between about 650° C. to about 750° C., more generally between about 600° C. to about 800° C., preferably at about 750° C., for a duration between about 10 seconds to about 60 seconds, more generally between about 10 seconds to about 90 seconds, preferably about 1 minute, and causes silicide-forming metal layer 52 and the deposited silicon of diode 14 to interact to form silicide layer 50, consuming all or a portion of the silicide-forming metal layer 52.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

In exemplary embodiments of this invention, carbon layer 12 includes DLC, or other carbon-based material, doped with another element, such as nitrogen, silicon, boron, phosphorous, fluorine, oxygen, or other similar element. In particular, by using a relatively small dopant concentration, carbon layer 12 may be fabricated to have a relatively high bulk resistivity (for compatibility with diode 14), but also have a reduced set voltage (so that current limits are not exceeded).

In exemplary embodiments of this invention, carbon layer 12 is formed in an iterative manner by depositing multiple DLC layers, each layer deposited on top the previous layer. After each DLC layer is formed, the deposited DLC layer is doped with a relatively small concentration of another element, such as nitrogen, silicon, boron, phosphorous, fluorine, oxygen, or other similar element. This process continues iteratively, by forming the next DLC layer on the underlying doped DLC layer, and then doping the newly deposited DLC layer to form a stack of doped DLC layers.

For simplicity, the following discussion will refer to nitrogen doping. This iterative deposition-nitrogen doping process continues until the stack of doped DLC layers has a thickness substantially equal to a desired thickness for carbon layer 12. In exemplary embodiments of this invention, carbon layer 12 has a desired thickness between about 10 angstroms and about 600 angstroms, more generally between about 1 angstrom and about 1000 angstroms. Other thicknesses may be used.

For example, each deposited DLC layer may have a thickness between about 3 angstroms and about 20 angstroms, more generally between about 3 angstroms and 50 angstroms. Other thicknesses may be used.

In exemplary embodiments of this invention, each DLC layer is doped with nitrogen to achieve a doping concentration of between about 0.001 at % to about 10 at %, and preferably between about 0.01 at % and about 0.1 at %. In at least one exemplary embodiment, each doped DLC layer has a nitrogen concentration of less than about 0.1 at %. This deposition-nitrogen doping process continues in an iterative manner until a desired thickness for the carbon-based memory element is achieved.

In exemplary embodiments of this invention, the nitrogen doping may be performed so that the nitrogen concentration in one or more DLC layers varies along the thickness of the layer. For example, a DLC layer may have a doping concentration gradient, with a higher dopant concentration at the top of the DLC layer, and a lower dopant concentration at the bottom of the DLC layer. The doping may be performed so that the DLC layer has maximum doping concentration of between about 0.001 at % to about 10 at %, and preferably between about 0.01 at % and about 0.1 at %.

Figure 3B:
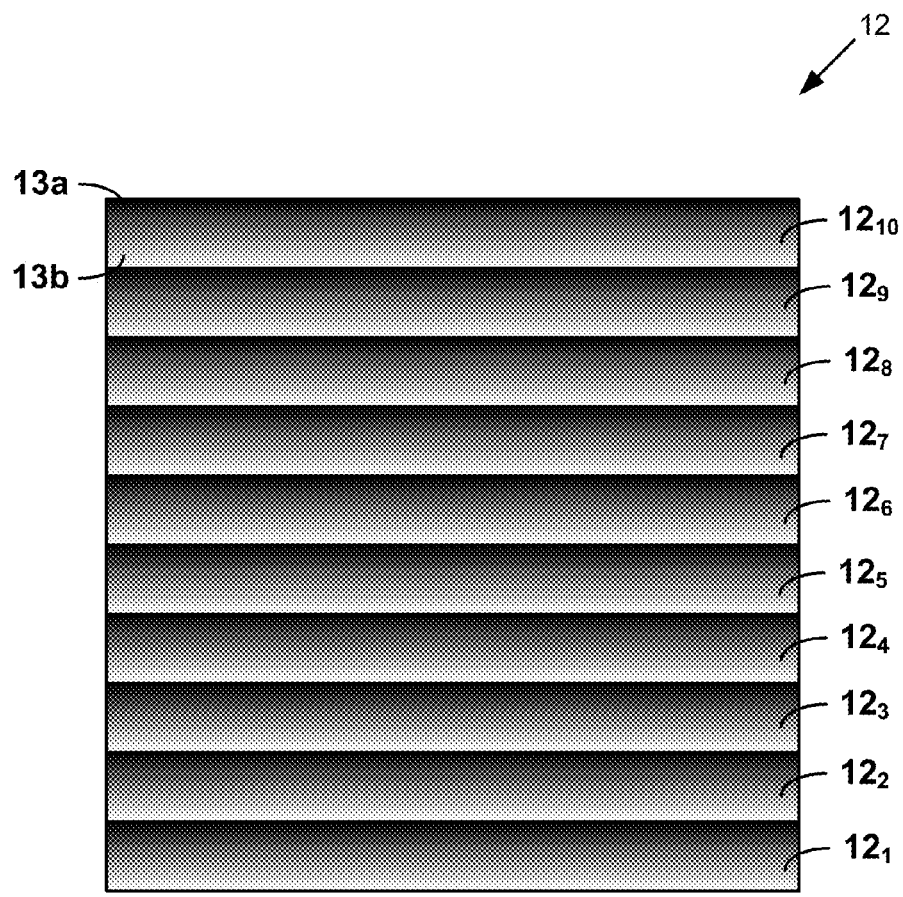
FIG. 3B is a cross-sectional view of an exemplary embodiment of a multi-layered carbon material in accordance with this invention.

For example, FIG. 3B illustrates carbon layer 12 formed by depositing ten separate DLC layers $12_N$, N=1, 2, ... 10, with each layer stacked directly on top of an underlying layer. In the illustrated example, each DLC layer $12_N$ may have a thickness of about 10 angstroms, so that carbon layer 12 has a desired thickness of about 100 angstroms. Persons of ordinary skill in the art will understand that the thickness of DLC layers $12_N$ may vary from layer to layer. For example, DLC layer $12_1$ may have a thickness of 8 angstroms, whereas DLC layer $12_2$ may have a thickness of about 12 angstroms. After each DLC layer $12_N$ is deposited, the deposited layer is doped with a relatively small concentration of nitrogen.

Thus, in the illustrated example, DLC layer $12_1$ is deposited, and then doped with a relatively small concentration nitrogen; DLC layer $12_2$ is deposited on top of DLC layer $12_1$, and then DLC layer $12_2$ is doped with a relatively small concentration nitrogen; DLC layer $12_3$ is deposited on top of DLC layer $12_2$, and then DLC layer $12_3$ is doped with a relatively small concentration nitrogen, and so on. In the illustrated embodiment, each DLC layer $12_N$ has a nitrogen concentration gradient, with a higher nitrogen concentration at the top 13*a* of the DLC layer $12_N$ to a lower nitrogen concentration at the bottom 13*b* of the DLC layer $12_N$. Persons of ordinary skill in the art will understand that the concentration gradients of DLC layers $12_N$, may not be identical to one another.

DLC layers $12_N$ may be formed using plasma-enhanced chemical vapor deposition ("PECVD"), physical vapor deposition ("PVD"), Filtered Cathodic Vacuum Arc ("FCVA"), or other similar method. Examples of such deposition processes are described below in connection with the description of FIG. 4. After each DLC layer $12_N$ is deposited, the layer is doped with nitrogen. Such nitrogen doping may be performed by exposing the deposited DLC layer $12_N$ to a plasma containing a nitrogen-bearing gas, such as $N_2$, $N_2H_4$, $NH_3$, or other similar nitrogen-bearing gas. Nitrogen doping may be achieved using any apparatus capable of generating a nitrogen-based plasma, such as those used to perform PVD, PECVD, etc. For example, the substrate may be exposed to an environment (e.g., the environment inside a PECVD processing chamber) having an increased concentration of one or more nitrogen-bearing gasses, such as $NH_3$, $N_2$, $N_2H_4$, or other similar gas. Examples of such doping processes are described below in connection with the description of FIG. 4.

Persons of ordinary skill in the art will understand that the nitrogen plasma treatment process parameters may be adjusted to control the plasma treatment depth during each treatment cycle. For example, the plasma treatment power and time may be adjusted to control the treatment depth to minimize the chance that a DLC layer (e.g., DLC layer $12_2$) will be exposed to plasma treatment of the subsequent layer (e.g., DLC layer $12_3$). The effectiveness of the plasma treatment depends on the thickness of the untreated layer, the treatment time and plasma conditions. At a fixed plasma power and treatment time, the chance that a DLC layer (e.g., DLC layer $12_2$) will be exposed to plasma treatment of the subsequent layer (e.g., DLC layer $12_3$) can be minimized by increasing the deposited layer thickness. In addition, the total nitrogen dopant concentration and the gradient of the nitrogen concentration in the deposited DLC layer $12_N$ can be adjusted by plasma treatment process parameters such as flow of the nitrogen-containing gas, RF power and treatment time.

Although not wanting to be bound to a particular theory, it is believed that nitrogen doping may reduce the set voltage of the carbon-based material by facilitating or "nucleating" the $sp^2$ structure in the material at a local level, thereby forming high-conductivity filaments, which result in a lower set voltage. By forming carbon layer 12 from multiple doped DLC layers $12_N$, the high conductivity filaments from one layer may be less likely to align with the filaments from adjacent layers. In this regard, by using a doping profile that creates a nitrogen concentration gradient in each DLC layer $12_N$, the high conductivity filaments from one layer may be less likely to align with the filaments from adjacent layers. Further, by doping each DLC layer $12_N$ with a relatively small nitrogen concentration, the bulk resistivity of carbon layer 12 may remain relatively high. In addition, the post-deposition doping of each DLC layer $12_N$ may effectively increase compressive stress on carbon layer 12, which may facilitate $sp^2$ to $sp^3$ structural change. Research has shown that that high temperature and high pressure are required for $sp^2$ to $sp^3$ structural change.

In an alternative exemplary embodiment of this invention, carbon layer 12 is formed with a stack of DLC layers $12_N$ that are alternately doped and undoped, with the nitrogen doping performed so that the nitrogen concentration in the doped carbon nitride layers is substantially continuous along the thickness of the layer. For example, a doped carbon nitride layer may have a doping concentration of between about 0.001 at % to about 10 at %, and preferably between about 0.01 at % and about 0.1 at %.

Persons of ordinary skill in the art will understand that each DLC layer $12_N$ alternatively may be doped with silicon, boron, phosphorous, fluorine, oxygen, or other similar element.

Exemplary Fabrication Processes for Memory Cells

Referring now to FIGS. 4A-4H, a first exemplary method of forming an exemplary memory level in accordance with this invention is described. In particular, FIGS. 4A-4H illustrate an exemplary method of forming an exemplary memory level including memory cells 10 of FIG. 3. As will be described below, the first memory level includes a plurality of memory cells that each include a steering element and a carbon-based reversible resistance switching element coupled to the steering element. Additional memory levels may be fabricated above the first memory level (as described previously with reference to FIGS. 2C-2D).

Figure 4A:
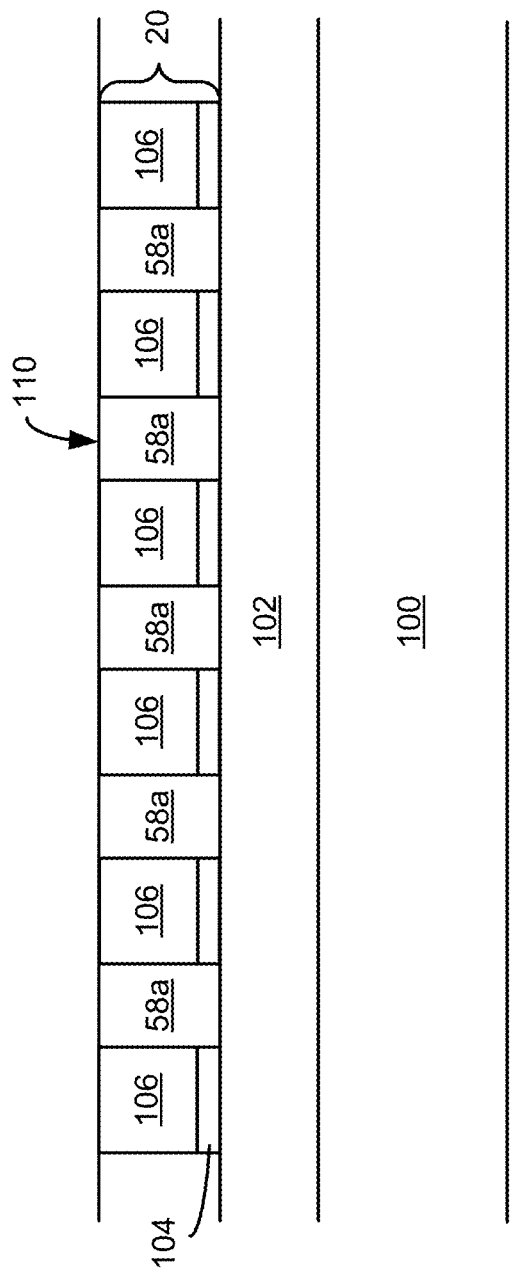

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other similar insulating layer.

Following formation of isolation layer 102, an adhesion layer 104 is formed over isolation layer 102 (e.g., by PVD or other similar method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), PVD, etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
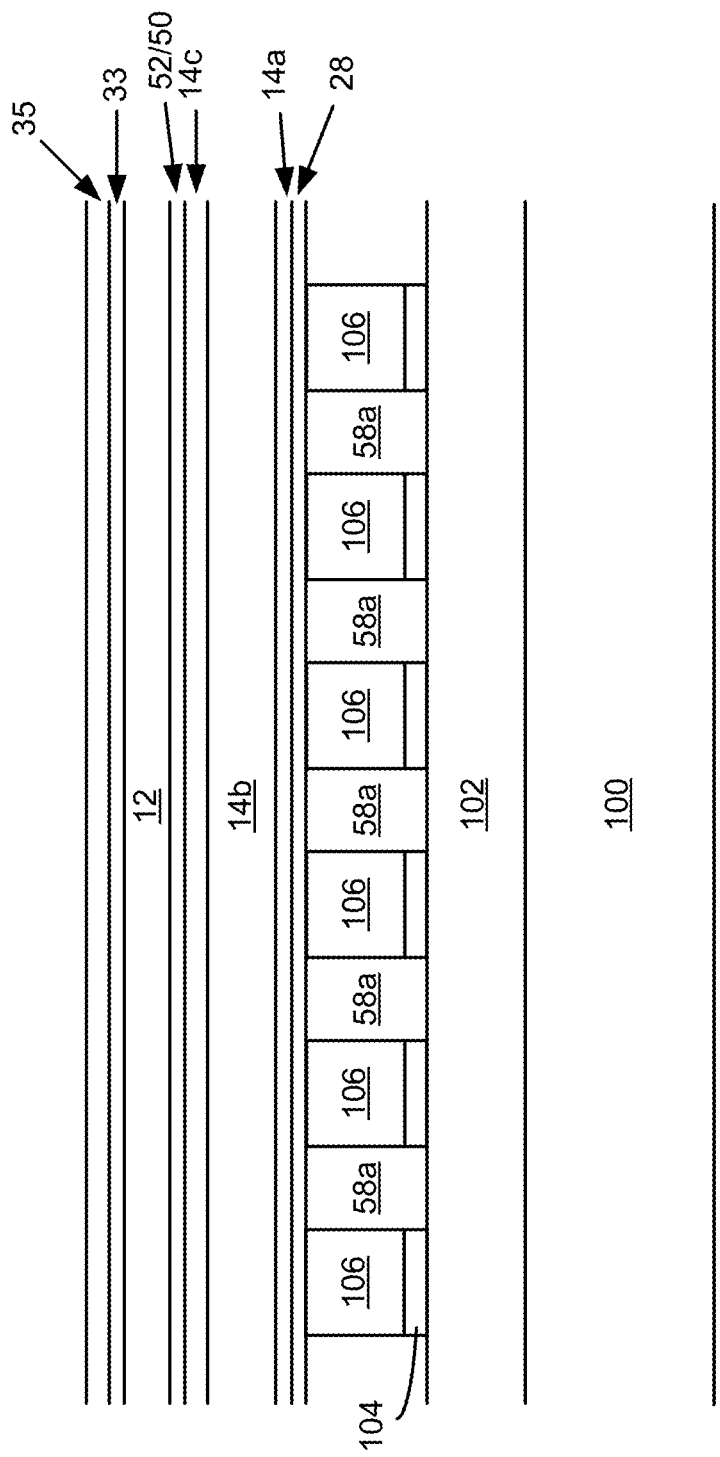

Following planarization, the diode structures of each memory cell are formed. With reference to FIG. 4B, a barrier layer 28 is formed over planarized top surface 110 of substrate 100. Barrier layer 28 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 2 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 application, previously incorporated).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about 1-5× $10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed to form silicide layer 50, consuming all or a portion of the silicide-forming metal layer 52. The RTA step may be performed at a temperature between about 650° C. and about 750° C., more generally between about 600° C. and about 800° C., preferably at about 750° C., for a duration between about 10 seconds and about 60 seconds, more generally between about 10 seconds and about 90 seconds, preferably about 60 seconds. Following the RTA step, any residual nitride layer from silicide-forming metal layer 52 may be stripped using a wet chemistry, as described above, and as is known in the art.

Following the RTA step and the nitride strip step, a barrier layer 24 is deposited. Barrier layer 24 may be about 20 to about 500 angstroms, and preferably about 200 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. Any suitable method may be used to form barrier layer 24. For example, PVD, atomic layer deposition ("ALD"), or the like may be used.

Next, carbon layer 12 is deposited over barrier layer 24. In exemplary embodiments of the invention, carbon layer 12 is formed from DLC in an iterative manner by depositing multiple DLC layers $12_N$ (not shown in FIG. 4) on top of one another, and then doping each deposited DLC layer $12_N$ with a relatively small concentration of nitrogen. This deposition-nitrogen doping process continues in an iterative manner until a desired thickness for carbon layer 12 is achieved. Persons of ordinary skill in the art will understand that other dopants may be used, such as silicon, boron, phosphorous, fluorine, oxygen, or other similar element.

In exemplary embodiments of this invention, each deposited DLC layer $12_N$ may have a thickness between about 5 angstroms and about 20 angstroms, more generally between about 5 angstroms and 50 angstroms. Other thicknesses may be used. In exemplary embodiments of this invention, multiple DLC layers $12_N$ are deposited to form carbon layer 12 having a desired thickness between about 10 and about 100 angstroms, more generally between about 1 and about 1000 angstroms. Other thicknesses may be used.

In exemplary embodiments of this invention, after each DLC layer $12_N$ is deposited, the layer is doped with nitrogen to achieve a doping concentration of between about 0.001% to about 10%, and preferably between about 0.01% and about 0.1%. In at least one exemplary embodiment, each doped DLC layer $12_N$ has a nitrogen concentration of less than about 0.1%. This deposition-nitrogen doping process continues in an iterative manner until the desired thickness for the carbon-based memory element is achieved.

Table 1 below describes an exemplary process window for forming the DLC layers $12_N$ of carbon layer 12 within a PECVD chamber using a processing gas comprising one or more hydrocarbon compounds and a carrier/dilutant gas. Persons of ordinary skill in the art will understand that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4, and y ranging from about 2 to 10.

TABLE 1

EXEMPLARY PECVD PROCESS PARAMETERS

| PROCESS PARAMETER | EXEMPLARY RANGE | PREFERRED RANGE |
|---|---|---|
| $C_xH_y$ (x = 2-4, y = 2-10) Flow rate (sccm) | 50-2000 | 50-500 |
| Carrier/Precursor Ratio | 0.5:1-100:1 | 5:1-15:1 |
| Chamber Pressure (Torr) | 0.1-10 | 0.1-5 |
| $1^{st}$ RF frequency (Mhz) | 10-50 | 12-15 |
| $2^{nd}$ RF frequency (Khz) | 90-500 | 90-100 |
| $1^{st}$ RF Power Density (10-50 MHz) (W/cm$^2$) | 0.12-5 | 0.21-2.1 |
| $2^{nd}$ RF/$1^{st}$ RF Power Density Ratio | 0-5 | 0.2-0.6 |
| Process Temperature (° C.) | 150-650 | 350-650 |
| Heater to Showerhead Spacing (Mils) | 200-1000 | 250-550 |

In particular embodiments, carbon-based switching materials may be formed to exhibit sheet resistance ("Ω/□" or "ohms/square") for a 1000 angstrom film from about $1\times10^2$Ω/□ to about $1\times10^9$Ω/□, and more preferably about $1\times10^4$Ω/□ or greater. DLC films are amorphous and do not have long range order.

After each DLC layer $12_N$ is deposited, the layer is doped with nitrogen. Nitrogen doping may be achieved using any apparatus capable of generating a nitrogen-based plasma such as those used to perform PECVD, PVD, etc. Examples of processing parameters for performing such a post-deposition nitrogen doping using PECVD are presented in Table 2 below. Other than in-situ RF, the nitrogen plasma treatment also can be done with a remote downstream plasma, or inductively coupled plasma ("ICP"), or other similar process.

TABLE 2

EXEMPLARY PECVD NITROGEN PLASMA PARAMETERS

| PROCESS PARAMETER | BROAD RANGE | NARROW RANGE |
|---|---|---|
| $N_2$ flow (sccm) | 500-20000 | 1000-8000 |
| Chamber Pressure (Torr) | 0.1-10 | 2-8 |

TABLE 2-continued

EXEMPLARY PECVD NITROGEN PLASMA PARAMETERS

| PROCESS PARAMETER | BROAD RANGE | NARROW RANGE |
|---|---|---|
| $1^{st}$ RF Frequency (MHz) | 10-50 | 12-15 |
| $2^{nd}$ RF Frequency (KHz) | 90-500 | 90-100 |
| $1^{st}$ RF Power Density (W/cm$^2$) | 0.1-3 | 1.11-3.5 |
| $2^{nd}$ RF/$1^{st}$ RF Power Density (W/cm$^2$) | 0-5 | 0.15-2.5 |
| Process Temperature (° C.) | 150-650 | 350-650 |
| Heater-to-Showerhead Spacing (Mils) | 200-1000 | 250-550 |
| Time (s) | 2-60 | 2-30 |

Exemplary processing parameters for performing a post-deposition nitrogen doping using PVD are presented in Table 3 below.

TABLE 3

EXEMPLARY PVD NITROGEN DOPING PARAMETERS

| PROCESS PARAMETER | BROAD RANGE | NARROW RANGE |
|---|---|---|
| $N_2$ flow (sccm) | 50-3000 | 50-1000 |
| Chamber Pressure (Torr) | 0.001-25 | 0.01-1 |
| DC Power (W) | 50-3000 | 500-2000 |
| Process Temperature (° C.) | 25-1000 | 250-550 |
| Time (s) | 2-60 | 2-30 |

Persons of ordinary skill in the art will understand that other PECVD and PVD process conditions may be used for doping DLC layers $12_N$ with nitrogen, and that processes other than PECVD and PVD may be used to dope the DLC layers. Persons of ordinary skill in the art also will understand that other dopants may be used, such as silicon, boron, phosphorous, fluorine, oxygen, or other similar element.

This process of depositing a DLC layer $12_N$, and then doping the deposited layer with nitrogen is repeated until carbon layer 12 has a desired total thickness. In exemplary embodiments of this invention, the total thickness for carbon layer 12 may be between about 10 and about 100 angstroms, more generally between about 1 and about 200 angstroms. Other thicknesses may be used.

In an alternative exemplary embodiment of this invention, carbon layer 12 is formed with a stack of DLC layers $12_N$ that are alternately doped and undoped, with the nitrogen doping performed so that the nitrogen concentration in the doped layers is substantially continuous along the thickness of the layer. For example, a doped DLC layer may have a doping concentration of between about 0.001 at % to about 70 at %, and preferably between about 10 at % and about 70 at %.

Table 4 below describes an exemplary process window for forming the DLC layers $12_N$ of carbon layer 12 within a PECVD chamber using a processing gas comprising one or more hydrocarbon compounds and a carrier/dilutant gas. In some 10 embodiments, the hydrocarbon compounds may have the formula $C_xH_y$, with x ranging from about 2 to 4, and y ranging from about 2 to 10. To deposit a doped layer $12_N$, the carbon-containing precursor can be flowed with a nitrogen containing precursor (e.g., $N_2$) during the doping cycle to co-deposit a carbon nitride material.

TABLE 4

EXEMPLARY PECVD PLASMA PARAMETERS

| PROCESS PARAMETER | BROAD RANGE | NARROW RANGE |
|---|---|---|
| $C_xH_y$ (x = 2-4, y = 2-10) Flow Rate (sccm) | 100-5000 | 200-1500 |
| $N_2$ flow rate (sccm) | 1000-20000 | 5000-10000 |
| Chamber Pressure (Torr) | 0.2-10 | 3-7 |
| $1^{st}$ RF Frequency (MHz) | 10-50 | 12-15 |
| $2^{nd}$ RF Frequency (KHz) | 90-400 | 90-110 |
| $1^{st}$ RF Power Density (W/cm$^2$) | 0.8-5 | 1.0-2.5 |
| $2^{nd}$ RF Power Density (W/cm$^2$) | 0-2 | 0-1.4 |
| Process Temperature (° C.) | 200-650 | 350-550 |
| Heater-to-Showerhead Spacing (Mils) | 250-1000 | 300-550 |
| Time (s) | 2-60 | 2-20 |

In some embodiments in accordance with this invention, following formation of carbon layer 12, an in-situ anneal step may be performed in the deposition chamber of the next film prior to depositing the next film. In particular, the anneal may be performed in a vacuum or in the presence of one or more forming gases, at a temperature between about 200° C. to about 300° C., more generally between about 200° C. to about 450° C., for about 30 seconds to about 300 minutes. Suitable forming gases may include one or more of $N_2$, Ar, He, $H_2$, or inert gases. Preferred forming gases may include a mixture having above about 75% $N_2$ or Ar and below about 25% $H_2$. During annealing, suitable pressures may range from about 0.1 mT to about 10 T, more generally between about 0.1 mT to about 760 T.

Referring again to FIG. 4B, barrier layer 33 is formed over carbon layer 12. Barrier layer 33 may be about 5 to about 800 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Next, a metal layer 35 may be deposited over barrier layer 33. For example, between about 800 to about 1200 angstroms, more generally between about 500 angstroms to about 1500 angstroms, of tungsten may be deposited on barrier layer 33. Other materials and thicknesses may be used. Any suitable method may be used to form metal layer 35. For example, CVD, PVD, or the like may be employed. As described in more detail below, metal layer 35 may be used as a hard mask layer, and also may be used as a stop during a subsequent chemical mechanical planarization ("CMP") step. A hard mask is an etched layer which serves to pattern the etch of an underlying layer.

As shown in FIG. 4C, metal layer 35 is patterned and etched to form patterned metal hardmask regions 35. Patterned metal hardmask regions 35 may have about the same pitch and about the same width as conductors 20 below, such that each patterned metal hardmask regions 35 is formed on top of a conductor 20. Some misalignment may be tolerated. Persons of ordinary skill in the art will understand that patterned metal hardmask regions 35 may have a smaller width than conductors 20.

For example, photoresist ("PR") may be deposited on metal layer 35, patterned using standard photolithography techniques, and then the photoresist may be removed. Alternatively, a hard mask of some other material, for example silicon dioxide, may be formed on top of metal layer 33, with bottom antireflective coating ("BARC") on top, then patterned and etched. Similarly, dielectric antireflective coating ("DARC") may be used as a hard mask.

Figure 4D:
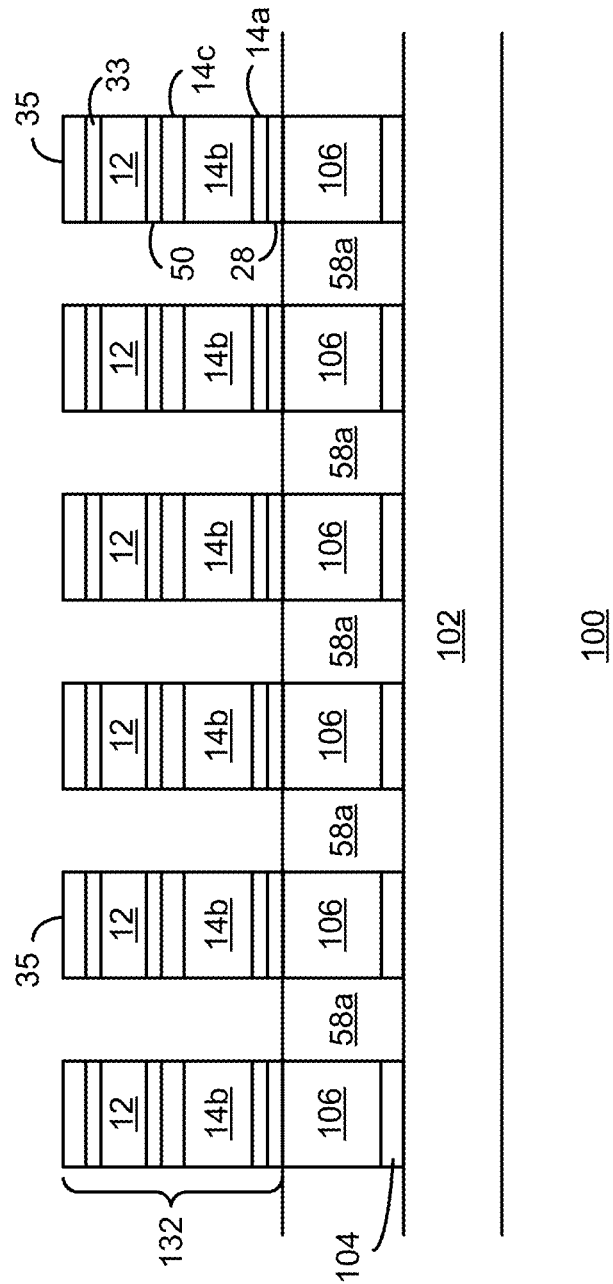

As shown in FIG. 4D, metal hardmask regions 35 are used to pattern and etch barrier layer 33, carbon layer 12, silicide-forming metal layer 52, diode layers 14a-14c and barrier layer 28 to form pillars 132. Pillars 132 may have about the same pitch and about the same width as conductors 20 below, such that each pillar 132 is formed on top of a conductor 20. Some misalignment may be tolerated. Persons of ordinary skill in the art will understand that pillars 132 may have a smaller width than conductors 20.

Any suitable etch chemistries, and any suitable etch parameters, flow rates, chamber pressures, power levels, process temperatures, and/or etch rates may be used. In some embodiments, barrier layer 33, carbon nitride barrier layer 31, carbon element 12, barrier layer 24, silicide-forming metal layer 52, diode layers 14a-14c and barrier layer 28 may be patterned using a single etch step. In other embodiments, separate etch steps may be used. The etch proceeds down to dielectric layer 58a.

In some exemplary embodiments, the memory cell layers may be etched using chemistries selected to minimize or avoid damage to carbon material. For example, $O_2$, CO, $N_2$, or $H_2$, or other similar chemistries may be used. In embodiments in which CNT material is used in the memory cells, oxygen ("$O_2$"), boron trichloride ("$BCl_3$") and/or chlorine ("$Cl_2$") chemistries, or other similar chemistries, may be used. Any suitable etch parameters, flow rates, chamber pressures, power levels, process temperatures, and/or etch rates may be used. Exemplary methods for etching carbon material are described, for example, in U.S. patent application Ser. No. 12/415,964, "Electronic Devices Including Carbon-Based Films Having Sidewall Liners, and Methods of Forming Such Devices," filed Mar. 31, 2009, which is hereby incorporated by reference in its entirety for all purposes.

After the memory cell layers have been etched, pillars 132 may be cleaned. In some embodiments, a dilute hydrofluoric/sulfuric acid clean is performed. Post-etch cleaning may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for about 60 seconds. Megasonics may or may not be used. Alternatively, $H_2SO_4$ may be used.

After pillars 132 have been cleaned, an in-situ anneal or degas in vacuum step may be performed. Carbon material tends to absorb moisture, especially during a wet clean process. This is problematic, because trapped moisture may result in de-lamination of carbon material and degradation in switching. In-situ annealing or degas in vacuum helps to drive out moisture before the next process step. In particular, the in-situ anneal or degas in vacuum is performed in the chamber of the next processing step. Degas in vacuum can also be performed in a transfer chamber or loadlock mounted on the same platform as that process chamber. For example, if the next processing step is formation of a sidewall liner, the in-situ anneal is performed in the chamber used to form the sidewall liner. The in-situ anneal may be performed at a temperature between about 200° C. and about 350° C., more generally between about 200° C. and about 450° C., for a duration between about 1 to about 2 minutes, more generally between about 30 seconds and about 5 minutes, at a pressure of between about 0.1 mT to about 10 T, more generally between about 0.1 mT to about 760 T. Alternatively, the in-situ anneal may be performed in an environment containing Ar, He, or $N_2$, or a forming gas containing $H_2$ and $N_2$, at a flow rate of between about 1000 to about 8000 sccm, more generally between about 1000-20000 sccm. If degas in vacuum step is used instead of in-situ annealing, the degas is performed at a pressure between about 0.1 mT to about 50 mT, and at a temperature between about room temperature to about 450° C.

Figure 4E:
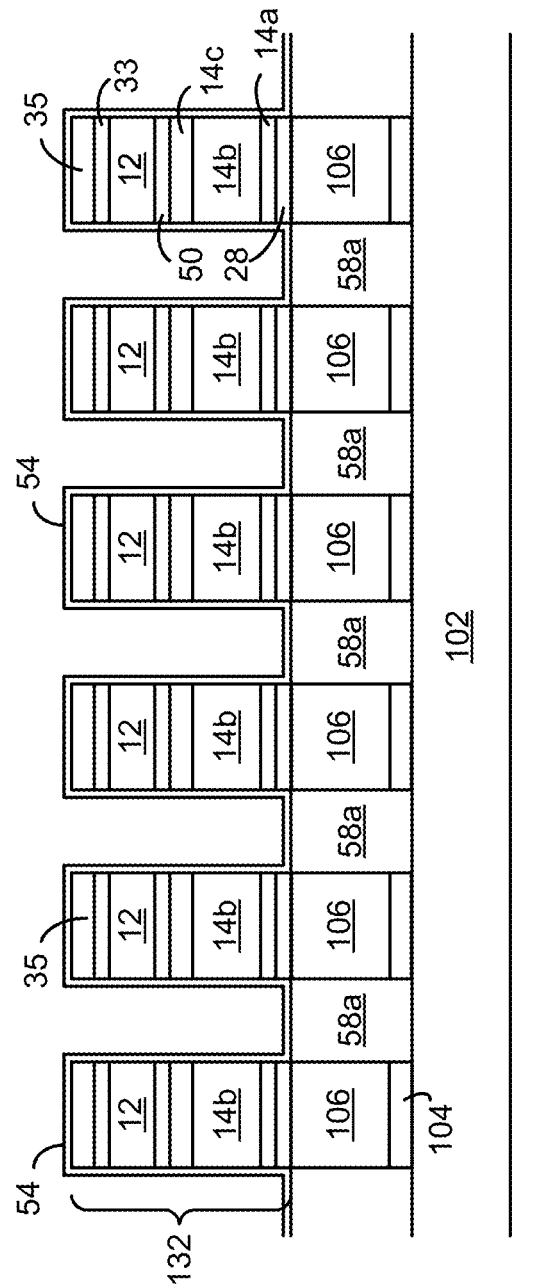

Next, a conformal dielectric liner 54 is deposited above and around pillars 132, resulting in the exemplary structure illustrated in FIG. 4E. Dielectric liner 54 may be formed with an oxygen-poor deposition chemistry (e.g., without a high density of oxygen plasma) to protect sidewalls of carbon layer 12 during a subsequent deposition containing a high oxygen plasma density of gap-fill dielectric 58b (e.g., $SiO_2$) (not shown in FIG. 4E).

In an exemplary embodiment of this invention, dielectric liner 54 may be formed from boron nitride, such as described in commonly owned co-pending U.S. patent application Ser. No. 12/536,457, "A Memory Cell That Includes A Carbon-Based Memory Element And Methods Of Forming The Same," filed Aug. 5, 2009, which is incorporated by reference herein in its entirely for all purposes. Alternatively, dielectric sidewall liner 54 may be formed from other materials, such as SiN, $Si_xC_yN_z$, $Si_xO_yN_z$, $Si_xB_yN_z$, (with low O content), where x, y and z are non-zero numbers resulting in stable compounds. Persons of ordinary skill in the art will understand that other dielectric materials may be used to form dielectric liner 54.

In one exemplary embodiment, a SiN dielectric sidewall liner 54 may be formed by PECVD using the process parameters listed in Table 5. Liner film thickness scales linearly with time. Other powers, temperatures, pressures, thicknesses and/or flow rates may be used.

TABLE 5

PECVD SiN LINER PROCESS PARAMETERS

| PROCESS PARAMETER | EXEMPLARY RANGE | PREFERRED RANGE |
| --- | --- | --- |
| $SiH_4$ Flow Rate (slm) | 0.05-2.0 | 0.05-1 |
| $NH_3$ Flow Rate (slm) | 1-10 | 2-8 |
| $N_2$ Flow Rate (slm) | 0.5-20 | 1.0-5 |
| Temperature (° C.) | 300-650 | 350-450 |
| Low Frequency Bias (kW) | 0-2 | 0.05-0.6 |
| High Frequency Bias (kW) | 0-2 | 0.05-0.6 |
| Thickness (Angstroms) | 100-500 | 100-350 |

Figure 4F:
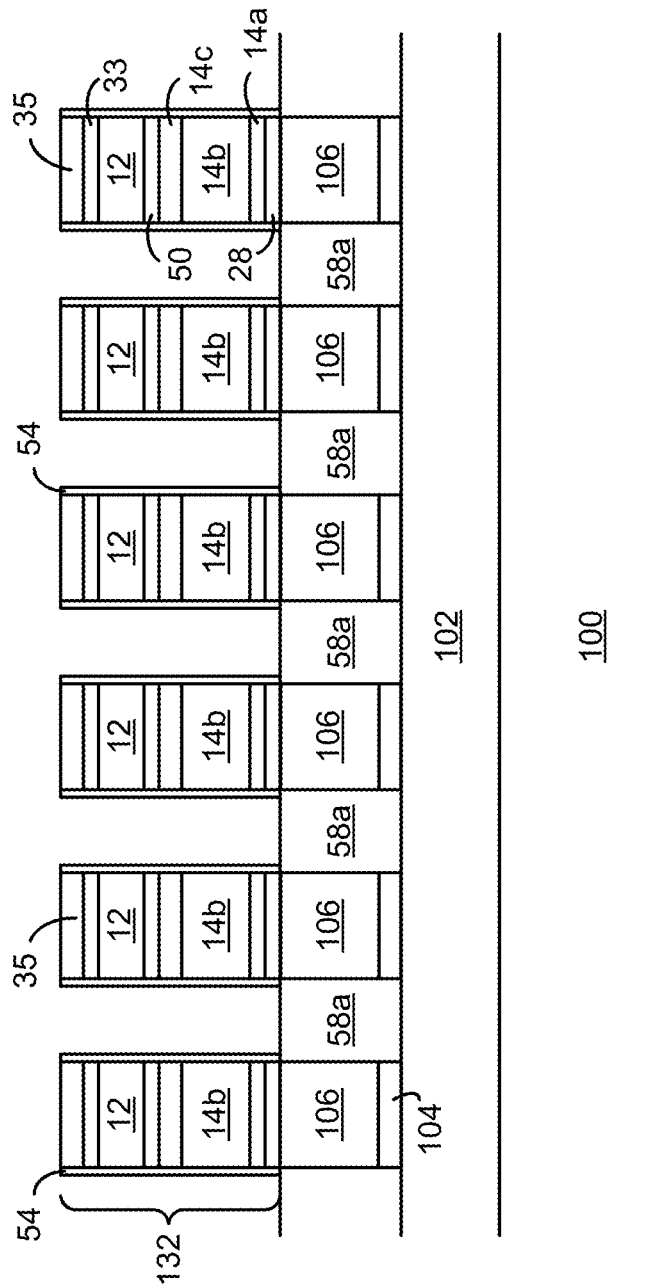
Figure 4G:
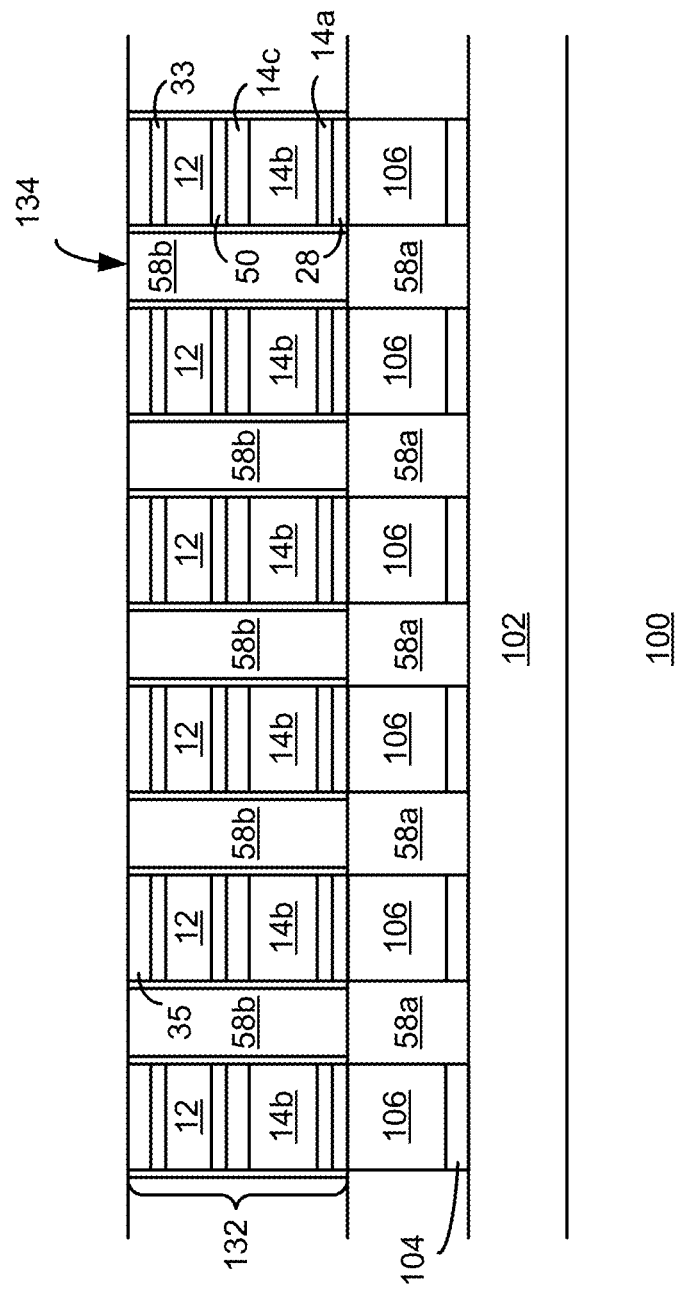

With reference to FIG. 4F, an anisotropic etch is used to remove lateral portions of sidewall liner 54, leaving only sidewall portions of sidewall liner 54 on the sides of pillars 132. For example, a sputter etch or other suitable process may be used to anisotropically etch sidewall liner 54. Dielectric sidewall liner 54 may protect the carbon material of carbon layer 12 from damage during deposition of dielectric layer 58b (not shown in FIG. 4F), described below.

Next, a dielectric layer 58b may be deposited over pillars 132 to fill the voids between pillars 132. For example, approximately 200-7000 angstroms of silicon dioxide may be deposited and planarized using CMP or an etchback process to remove excess dielectric material 58b and form a planar surface 134, resulting in the structure illustrated in FIG. 4G. During the planarization process, metal hardmask regions 35 may be used as a CMP stop. Planar surface 134 includes exposed top surfaces of pillars 132 separated by dielectric material 58b (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4H:
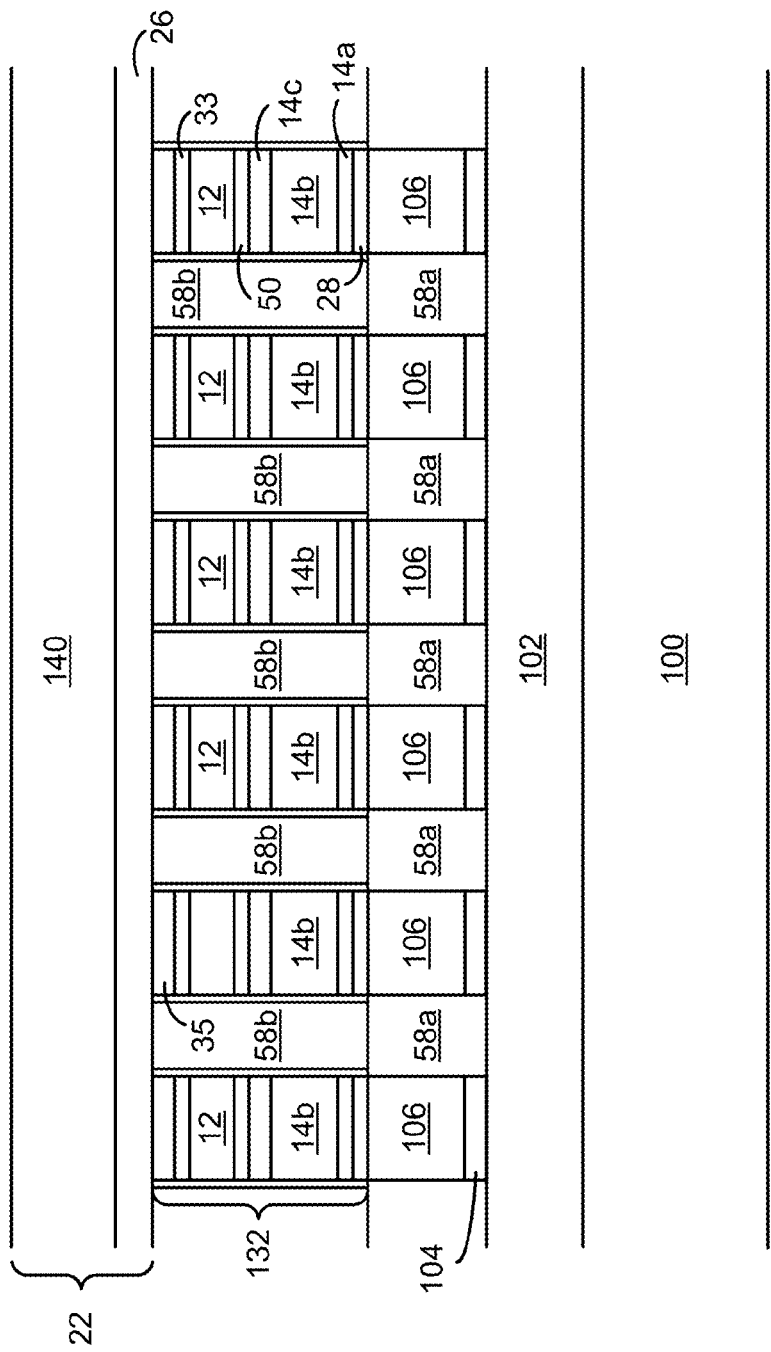

With reference to FIG. 4H, second conductors 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that silicide layers 50 may serve as "crystallization templates" or "seeds" for adjacent deposited silicon as the deposited silicon crystallizes (e.g., silicide layer 50 enhances the crystalline structure of silicon diode 14 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600° C. to about 800° C., and more preferably between about 650° C. to about 750° C. Other annealing times, temperatures and/or environments may be used.

Persons of ordinary skill in the art will understand that alternative memory cells in accordance with this invention may be fabricated in other similar techniques. For example, memory cells may be formed that include carbon layer 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, carbon layer 12 may be located below diodes 14. As stated, although the invention has been described primarily with reference to amorphous carbon, other carbon-based materials may be similarly used. Further, each carbon-based layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell comprising a carbon-based reversible resistance switching material, the method comprising:
   (a) depositing a carbon layer of a carbon material above a substrate;
   (b) doping the deposited carbon layer with a dopant;
   (c) depositing another carbon layer on top of the doped carbon layer; and
   (d) iteratively repeating steps (b) and (c) to form a stack of doped carbon layers having a desired thickness,
   wherein doping comprises forming a dopant concentration gradient between a top and a bottom of the deposited carbon layer, and the concentration gradient ranges from a higher concentration at the top of the doped carbon layer to a lower concentration at the bottom of the doped carbon layer.

2. The method of claim 1, wherein each deposited carbon layer has a thickness between about 5 and about 50 angstroms.

3. The method of claim 1, wherein each deposited carbon layer has a thickness between about 5 and about 20 angstroms.

4. The method of claim 1, wherein the desired thickness of the stack is between about 1 and 1000 angstroms.

5. The method of claim 1, wherein the desired thickness of the stack is between about 10 and 600 angstroms.

6. The method of claim 1, wherein the dopant is selected from the group comprising one or more of nitrogen, silicon, boron, phosphorous, fluorine, and oxygen.

7. The method of claim 1, wherein each doped layer has a dopant concentration of between about 0.001 at % and about 10 at %.

8. The method of claim 1, wherein each doped layer has a dopant concentration of between about 0.01 at % and about 0.1 at %.

9. The method of claim 1, wherein the carbon material comprises amorphous diamond-like carbon.

10. The method of claim 1, wherein the carbon material is $sp^3$ hybridized.

11. The method of claim 1, wherein the carbon material comprises a nanocrystalline graphitic structure.

12. The method of claim 1, wherein depositing the carbon layer comprises depositing the carbon-based reversible resistance switching material using a plasma enhanced chemical vapor deposition technique.

13. The method of claim 1, wherein doping the deposited carbon layer comprises doping the deposited carbon layer using a chemical vapor deposition technique.

14. The method of claim 1, wherein doping the deposited carbon layer comprises doping the deposited carbon layer using a plasma enhanced chemical vapor deposition technique.

15. The method of claim 1, wherein doping is performed using a nitrogen bearing gas.

16. The method of claim 15, wherein the nitrogen-bearing gas is selected from the group consisting of $N_2$, $N_2H_4$ and $NH_3$.

17. The method of claim 1, further comprising forming a steering element coupled to the stack of doped carbon layers.

18. The method of claim 17, wherein the steering element comprises a p-n or p-i-n diode.

19. The method of claim 17, wherein the steering element comprises a polycrystalline diode.

20. A memory cell formed according to the method of claim 1.

* * * * *